United States Patent
Zschätzsch et al.

(10) Patent No.: US 9,368,513 B2
(45) Date of Patent: Jun. 14, 2016

(54) HIGHLY CONFORMAL EXTENSION DOPING IN ADVANCED MULTI-GATE DEVICES

(71) Applicant: GLOBALFOUNDRIES Inc., Grand Cayman (KY)

(72) Inventors: Gerd Zschätzsch, Dresden (DE); Stefan Flachowsky, Dresden (DE); Dominic Thurmer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/934,369

(22) Filed: Nov. 6, 2015

(65) Prior Publication Data

US 2016/0071886 A1    Mar. 10, 2016

Related U.S. Application Data

(62) Division of application No. 13/946,103, filed on Jul. 19, 2013, now Pat. No. 9,209,274.

(51) Int. Cl.
| | |
|---|---|
| *H01L 27/12* | (2006.01) |
| *H01L 29/78* | (2006.01) |
| *H01L 29/08* | (2006.01) |
| *H01L 27/092* | (2006.01) |

(52) U.S. Cl.
CPC ........ *H01L 27/1211* (2013.01); *H01L 27/0924* (2013.01); *H01L 29/0847* (2013.01); *H01L 29/785* (2013.01); *H01L 29/7834* (2013.01)

(58) Field of Classification Search
CPC ............ H01L 27/0924; H01L 27/1211; H01L 21/823431; H01L 21/823821; H01L 21/823418; H01L 21/823814; H01L 29/785; H01L 29/66795; H01L 2924/13067
See application file for complete search history.

(56) References Cited

U.S. PATENT DOCUMENTS

| | | | |
|---|---|---|---|
| 7,384,838 B2 * | 6/2008 | Hsu | .................. H01L 29/66795 438/230 |
| 2004/0104442 A1 | 6/2004 | Feudel et al. | |
| 2011/0309333 A1 | 12/2011 | Cheng et al. | |

OTHER PUBLICATIONS

Examination Report for Taiwan Patent Application No. 103121137 dated Oct. 19, 2015.

* cited by examiner

*Primary Examiner* — Jose R Diaz
(74) *Attorney, Agent, or Firm* — Amerson Law Firm, PLLC (57) ABSTRACT

A semiconductor device includes a semiconductor material positioned above a substrate and a gate structure positioned above a surface of the semiconductor material, the gate structure covering a non-planar surface portion of the surface. A sidewall spacer is positioned adjacent to the gate structure and includes first dopants having one of an N-type and a P-type conductivity, wherein the sidewall spacer covers an entire sidewall surface of the gate structure and partially covers the surface of the semiconductor material. Source/drain extension regions that include the first dopants are positioned within the non-planar surface portion and in alignment with the sidewall spacer, wherein a concentration of the first dopants within a portion of the sidewall spacer proximate the non-planar surface portion substantially corresponds to a concentration of the first dopants within the source/drain extension regions proximate the non-planar surface portion.

16 Claims, 6 Drawing Sheets

HIGHLY CONFORMAL EXTENSION DOPING IN ADVANCED MULTI-GATE DEVICES

BACKGROUND

1. Field of the Disclosure

Generally, the present subject matter relates to highly conformal extension doping in advanced multi-gate devices, and in particular to various multi-gate semiconductor devices having highly conformal source/drain extension regions.

2. Description of the Related Art

The majority of present-day integrated circuits (ICs) are implemented by using a plurality of interconnected field effect transistors (FETs), also called metal oxide semiconductor field effect transistors (MOSFETs) or simply MOS transistors. Typically, present-day ICs are implemented by millions of MOSFETs formed in or on a semiconductor material provided on a substrate with a given surface area.

The basic function of a MOSFET is that of an electronic switching element, wherein a current through a channel between source and drain of a MOSFET is controlled by a gate to which a voltage is applied. Particularly, the conductivity state of a MOSFET is changed when applying a voltage to the gate such that the applied voltage passes a certain voltage value, usually referred to as threshold voltage (Vt). The switching behavior of a MOSFET is, therefore, substantially characterized by the value of Vt. In general, Vt depends nontrivially on the transistor's properties, such as gate materials, etc., and is, e.g., very sensitive to the concentration of dopants in the channel, drain and source.

Progress in semiconductor techniques has steadily led to increasing integration densities and decreasing sizes of semiconductor devices and semiconductor device features. For example, efforts have been made to develop faster ICs by reducing the length of gate electrodes in MOSFETs and accordingly achieving smaller channel lengths. As a result, conventional fabrication techniques have been pushed to their limits, challenging the abilities to produce finely defined features at presently-required scales reaching deep into the nanometer regime.

In order to circumvent challenges encountered in scaling current MOSFETs, recent approaches have been directed away from fabricating MOSFETs having a gate electrode overlying a two-dimensional or planar surface of a semiconductor material (planar MOSFET) towards MOSFET configurations in which the gate electrode is formed on a substantially non-planar surface of a semiconductor material. An example of such a non-planar configuration is given by a finFET where a fin is formed in or on a surface of a semiconductor material and the gate electrode overlies the fin such that a conducting channel within the fin is partially enclosed by the gate electrode covering the fin at more than one face as opposed to planar MOSFET configurations. In comparison to planar MOSFET configurations, the drive current capability and control of the conductivity of a channel is improved in non-planar MOSFET configurations.

In advanced semiconductor manufacturing techniques, independent from whether planar or non-planar configurations are implemented, conformal doping is a key issue because a MOSFET's performance crucially depends on how exactly required parameters are implemented during fabrication, particularly in advanced semiconductor devices where even small deviations from target values result in undue shifts in parameters in properties to be realized. For example, it is very important to form source/drain extension regions with a well-defined gate overlap and a good abruptness of the doping profiles so as to reproducibly implement a desired and required length of the channel region extending between source/drain regions. It is easy to see that deviations in the gate overlap and the abruptness of the doping profiles of source/drain extension regions have an increasing impact on the resulting length of a channel when reaching presently advanced technology nodes at 35 nm or smaller. Implantations of source/drain extension regions at advanced technology nodes do not satisfy conformity requirements at high doping levels.

U.S. Patent Publication No. 2004/0104442 shows a planar MOSFET configuration in which source/drain extension regions are formed by depositing a doped high-k material layer over a gate electrode and applying a thermal annealing process at an annealing temperature between about 800-1200° C. for an annealing time of 10 seconds to 30 minutes in order to diffuse dopants incorporated into a dielectric material of sidewall spacers into underlying extension regions without implanting the dopants into the extension regions.

However, incorporating deposition processes and diffusion processes into existing process flows is not a straightforward task as each change of established process flows may unexpectedly affect subsequent processing, as changing or replacing established process sequences and including additional diffusion causing sequences is likely to considerably change characteristics of devices under fabrication in such a way that process parameters of subsequent processes have to be adjusted anew in order to implement required device characteristics. In summary, deviations of established process flows hold a number of draw-backs affecting performance and reliability of devices under fabrication, such as increasing integration complexity and increasing thermal budgets.

It is, therefore, desirable to provide highly-conformal source/drain extension regions in semiconductor devices having non-planar configurations.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

The present disclosure is directed to various semiconductor devices and device structures having highly conformal source/drain extension regions. In one exemplary embodiment disclosed herein, an illustrative semiconductor device includes, among other things, a semiconductor material positioned above a substrate and a gate structure positioned above a surface of the semiconductor material, the gate structure covering a non-planar surface portion of the surface. Additionally, a sidewall spacer is positioned adjacent to the gate structure and includes first dopants having one of an N-type and a P-type conductivity, wherein the sidewall spacer covers an entire sidewall surface of the gate structure and partially covers the surface of the semiconductor material. Source/drain extension regions that include the first dopants are positioned within the non-planar surface portion and in alignment with the sidewall spacer, wherein a concentration of the first dopants within a portion of the sidewall spacer proximate the non-planar surface portion substantially corresponds to a concentration of the first dopants within the source/drain extension regions proximate the non-planar surface portion.

Another illustrative embodiment disclosed herein is a semiconductor device structure that includes a first device region and a second device region positioned in a semiconductor material, the semiconductor material being positioned above a substrate. A first gate structure is positioned above the first device region and a second gate structure is positioned above the second device region, wherein the first gate structure covers a first non-planar surface portion of the first device region and the second gate structure covers a second non-planar surface portion of the second device region. The disclosed semiconductor device structure also includes, among other things, a first sidewall spacer positioned adjacent to the first gate structure, the first sidewall spacer covering an entire sidewall surface of the first gate structure and including first dopants having a first type of conductivity. A second sidewall spacer is positioned adjacent to the second gate structure, the second sidewall spacer covering an entire sidewall surface of the second gate structure and including second dopants having a second type of conductivity that is opposite of the first type of conductivity. Furthermore, first source/drain extension regions including the first dopants are positioned within the first device region and in alignment with the first sidewall spacer, wherein a concentration of the first dopants within a portion of the first sidewall spacer proximate the first source/drain extension regions substantially corresponds to a concentration of the first dopants within a portion of the first source/drain extension regions proximate the first sidewall spacer. Moreover, second source/drain extension regions including second dopants are positioned within the second device region and in alignment with the second sidewall spacer, wherein a concentration of the second dopants within a portion of the second sidewall spacer proximate the second source/drain extension regions substantially corresponds to a concentration of the second dopants within a portion of the second source/drain extension regions proximate the second sidewall spacer.

In a further exemplary embodiment, a semiconductor device is disclosed that includes one or more elongated semiconductor lines positioned above an insulating substrate, and a gate structure extending across and positioned all around a portion of each of the one or more elongated semiconductor lines, wherein a lower portion of the gate structure is embedded in the insulating substrate and extends below a lower surface of the portion of each of the one or more elongated semiconductor lines. The illustrative semiconductor device further includes, among other things, a sidewall spacer positioned adjacent the gate structure, the sidewall spacer including first dopants having one of an N-type and a P-type conductivity. Additionally, source/drain extension regions including the first dopants are positioned within each of the one or more elongated semiconductor lines, wherein a concentration of the first dopants within a portion of the sidewall spacer proximate the source/drain extension regions within each of the one or more elongated semiconductor lines substantially corresponds to a concentration of the first dopants within a portion of the source/drain extension regions proximate the sidewall spacer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to semiconductor device structures and particularly to semiconductor devices such as metal oxide semiconductor devices or MOS devices. The person skilled in the art will appreciate that, although the expression "MOS device" is used, no limitation to a metal-containing gate material and/or to an oxide-containing gate dielectric material is intended. Semiconductor devices of the present disclosure and particularly MOS devices as illustrated by means of some illustrative embodiments as described herein concern devices fabricated by using advanced technologies. Semiconductor devices and particularly MOS devices of the present disclosure are fabricated by technologies applied to approach technology nodes smaller than 100 nm, for example smaller than 50 nm, or smaller than 35 nm. The person skilled in the art will appreciate that the present disclosure suggests semiconductor devices, and particularly MOS devices, comprising gate structures such as gate stacks having a gate electrode material layer and a gate dielectric material layer with a length dimension smaller than 100 nm, for example smaller than 50 nm, or smaller than 35 nm. A length dimension may be understood as taken along a direction having a non-vanishing projection along a direction of a current flow between source and drain when the MOS device is in an ON state, the length dimension being, for example, parallel to the direction of current flow between source and drain. The present disclosure suggests providing methods of achieving reliable encapsulation of gate structures at very early stages of fabrication.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. A circuit designer can mix and match device types, using PMOS and NMOS transistors, stressed and unstressed, to take advantage of the best characteristics of each device type as they best suit the circuit being designed. The person skilled in the art understands that stress and strain may be generally described with regard to the tensile modulus.

In describing the following figures, semiconductor devices, semiconductor device structures and methods of forming a semiconductor device and a semiconductor device structure in accordance with various exemplary embodiments of the present disclosure will be illustrated. The described process steps, procedures and materials are to be considered only as exemplary embodiments designed to illustrate to one of ordinary skill in the art methods for practicing the invention. However, it is to be understood that the invention is not exclusively limited to the illustrated and described exemplary embodiments, as many possible modifications and changes exist which will become clear to one of ordinary skill in the art when studying the present detailed description together with the accompanied drawings and the above background and summary of the invention. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interest of brevity, many conventional steps will only be mentioned briefly herein, or will be omitted entirely without providing the well-known process details.

With regard to FIGS. 1A-1I, various illustrative embodiments of the present disclosure will be described in greater detail.

Figure 1A:
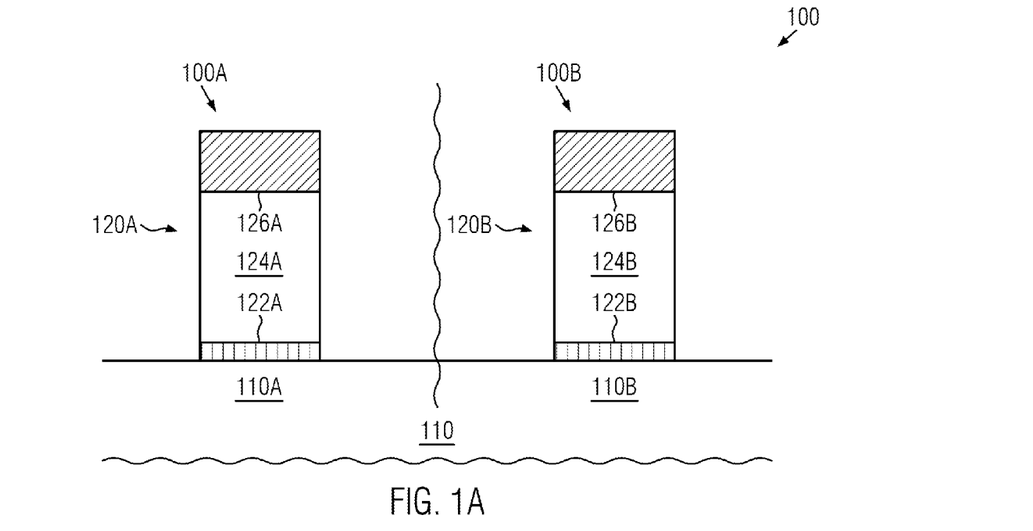
FIGS. 1A-1I schematically illustrate in cross-sectional views illustrative process flows of fabricating semiconductor devices and semiconductor device structures in accordance with illustrative embodiments of the present disclosure.

FIG. 1A shows a semiconductor device structure 100 and a semiconductor material 110 at an early stage during fabrication. The semiconductor material 110 may be provided in the form of a semiconductor layer that is provided or disposed on a surface of a substrate (not illustrated). The substrate (not illustrated) may be provided to implement a bulk configuration or an SOI (semiconductor-on-insulator) configuration. A first semiconductor device 100A is provided in or on a portion of the semiconductor material 110, which is illustrated in FIG. 1A and referred to in the following description as a first device region 110A. The first device region 110A may be obtained by patterning a surface of the semiconductor material 110 such that a portion of the first device region 110A may be provided in or on the surface of the semiconductor material 110. The first device region 110A may be given by a substantially non-planar surface portion provided on or on a surface of the semiconductor material 110. In an explicitly disclosed example, the first device region 110A may be provided in the form of a fin or a fin may be formed on the semiconductor material 110 so as to provide the first device region 110A. Further details in this respect will be explained with regard to FIGS. 2 and 3 below.

Furthermore, a second semiconductor device 100B is provided in or on a portion of the semiconductor material 110, which is illustrated in FIG. 1A and referred to in the following description as a second device region 110B. The second device region 110B may be obtained in analogy to the first device region 110A, particularly by patterning a surface of the semiconductor material 110 such that a portion of the second device region 110B may be provided in or on the surface of the semiconductor material 110. The second device region 110B may be given by a substantially non-planar surface portion provided on or on a surface of the semiconductor material 110. In an explicitly disclosed example, the second device region 110B may be provided in the form of a fin or a fin may be formed on the semiconductor material 110 so as to provide the second device region 110B. Further details in this respect will be explained with regard to FIGS. 2 and 3 below.

The semiconductor devices 100A and 100B and, accordingly, the first and second device regions 110A and 110B may be directly adjacent to each other or may be separated by one or more further semiconductor devices (not illustrated) which may be formed in between the first and second semiconductor devices 100A and 100B. It is further possible that the first and second device regions 110A and 110B are delineated and/or separated by one or more further insulating regions (not illustrated), such as shallow trench isolations (STI) or the like.

The semiconductor material 110 may be composed of silicon, silicon/germanium, silicon carbide and combinations thereof or may be of a semiconductor III/V material. The person skilled in the art will appreciate that the semiconductor material 110 may have dopants incorporated therein for forming at least one of a P-well and an N-well in at least one of the device regions 110A and 110B.

The first semiconductor device 100A comprises a first gate structure 120A formed over the first device region 110A. The second semiconductor device 100B comprises a second gate structure 120B formed over the second device region 110B. The first gate structure 120A may comprise a first gate dielectric 122A, while the second gate structure 120B comprises a second gate dielectric 122B. Herein, the first gate dielectric 122A is provided over the first device region 110A and the second gate dielectric 122B is provided over the second device region 110B. At least one of the first and second gate dielectrics 122A and 122B may comprise at least one of a high-k dielectric material and a work function adjusting material. High-k dielectric materials are known in the art and the person skilled in the art will appreciate that an appropriate high-k dielectric material may be chosen in accordance with overall process and device requirements. Work function adjusting materials are known in the art and the person skilled in the art will appreciate that an appropriate work function adjusting material may be chosen in accordance with overall process and device requirements.

The first gate structure 120A may further comprise a first gate electrode material 124A formed over the first gate dielectric 122A. The second gate structure 120B may comprise a second gate electrode material 124B formed over the second gate dielectric 122B. Furthermore, a first capping layer 126A may be formed on the first gate electrode material 124A so as to protect the gate electrode material 124A from subsequent processing, while a second capping layer 126B may be formed on the second gate electrode material 124B. The first capping layer 126A may be formed by silicon nitride or silicon oxide. The second capping layer 126B may be formed by silicon nitride or silicon oxide.

The person skilled in the art will appreciate that one of the first and second gate structures 120A, 120B may be formed by depositing a gate dielectric-forming material, a gate electrode-forming material and a gate cap-forming material over one of the first and second device regions 110A, 110B, while having the other device region of the first and second device regions 110A and 110B protected by a masking pattern (not illustrated). The person skilled in the art will appreciate that, in this way, layer stacks may be formed over the first and second device regions 110A, 110B. Subsequently, the gate structures 120A, 120B may be obtained by patterning the gate stacks by masking and anisotropically etching the gate stacks. In this way, the first and second gate structures 120A, 120B may be simultaneously or consecutively formed over the respective device regions 110A, 110B.

The preceding description of the first and second gate structures 120A, 120B is only illustrative and does not pose any limitation on the present disclosure. In having described the so-called "gate first approach" in which a gate electrode is already formed during early stages of fabrication, another alternative approach may be considered in which a dummy gate or replacement gate is first formed and, after having formed source/drain regions, the dummy gate or replacement gate is replaced by an actual gate electrode structure composed of gate dielectric and gate electrode (so-called "gate last" or "replacement gate" approach).

Figure 1B:
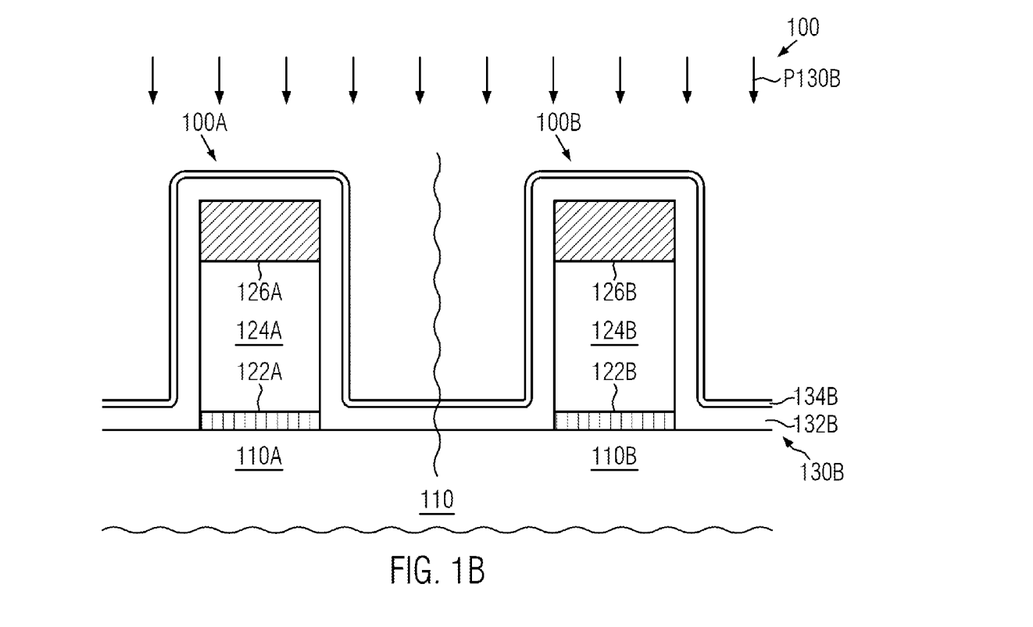

FIG. 1B shows the semiconductor device in a more advanced stage during fabrication in accordance with illustrative embodiments of the present disclosure. A spacer structure forming system 130B may be formed over the first and second semiconductor devices 100A and 100B. In accordance with a special illustrative embodiment herein, the spacer-forming system 130B may comprise a doped spacer-forming material layer 132B and a thin etch stop layer 134B. In other illustrative examples, the spacer-forming system 130B may only include the doped spacer-forming material layer 132B. However, the thin etch stop layer 134B may be omitted when fabricating a semiconductor device structure in which the semiconductor devices 100A and 100B are of the same conductivity type, i.e., the semiconductor devices 100A and 100B are either both of an NMOS type or both of a PMOS type. In other embodiments concerning fabricating a semiconductor device structure 100 having a first and second semiconductor device of opposing conductivity type, such as NMOS and PMOS devices, the thin etch stop layer 134B may be provided.

The spacer-forming system 130B may be formed by applying a deposition sequence P130B to the semiconductor device structure 100 as illustrated in FIG. 1A so as to deposit the spacer-forming system 130B over the first and second device regions 110A, 110B and over the first and second gate structures 120A and 120B (FIG. 1A). In case the spacer-forming system 130B consists of the doped spacer-forming material layer 132B and the thin etch stop layer 134B, the deposition sequence P130B may be comprised of a deposition process for depositing the doped spacer-forming material layer 132B and a further deposition process for depositing the thin etch stop layer 134B.

The doped spacer-forming material layer 132B may be formed by performing one of a chemical vapor deposition (CVD) process or a physical vapor deposition (PVD) process. In an illustrative example herein, the deposition sequence P130B may comprise an atomic layer deposition (ALD) process for depositing a doped spacer-forming material over the first and second device regions 110A and 110B and the first and second gate structures 120A and 120B (FIG. 1A).

The doped spacer-forming material layer 132B may be represented by a nitride material, such as SiN, having dopants incorporated therein. Dopants incorporated therein may be given by group III elements or group V elements. In illustrative embodiments employing the semiconductor material 110 based on silicon, an exemplary group III element may be given by boron, while exemplary group V elements may be such as phosphorous and/or aluminum, without limiting the present disclosure. This does not limit the present disclosure and, when considering the semiconductor material as being based on group III/V materials, other dopant elements may be taken into account. The person skilled in the art will appreciate that incorporation of dopants into spacer-forming material may be achieved by deposition of doped material, i.e., incorporating dopants when depositing the spacer-forming material by means of a PVD, e.g., PEPVD, or CVD process, e.g., ALD or PECVD, including a dopant-comprising precursor gas. In accordance with one illustrative embodiment herein, the thin etch stop layer 134B may comprise silicon oxide, such as $SiO_2$.

Figure 1C:
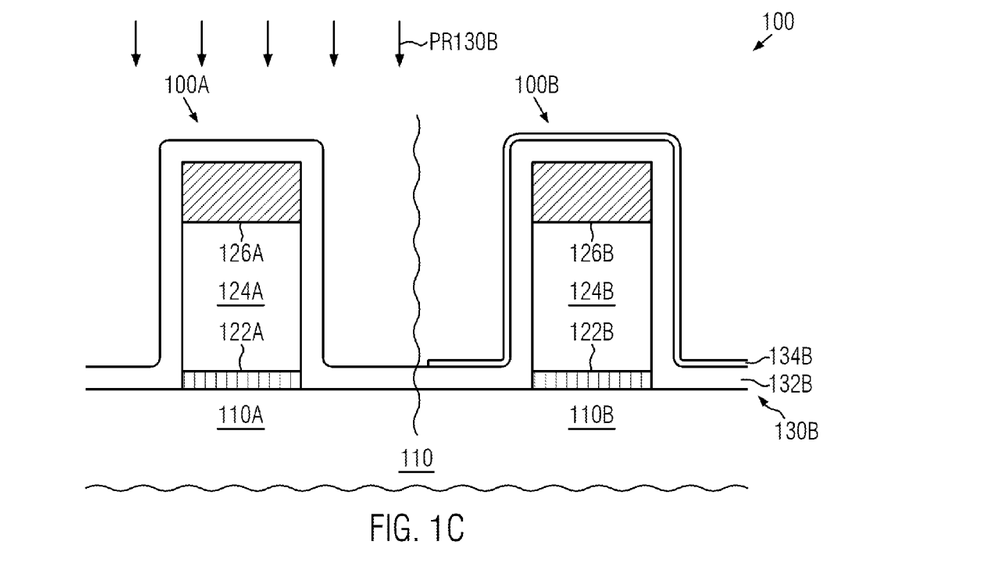

FIG. 1C illustrates the semiconductor device structure at a more advanced stage during fabrication, i.e., when a process PR130B is applied to the first device region 110A. When applying the process PR130B to the first device region 110A, the second device structure 100B is not exposed to the process PR130B. In illustrative embodiments herein, the second device structure 100B may have a mask pattern (not illustrated) formed thereon such that the second semiconductor device 100B is protected from any impact caused by the process PR130B.

The process PR130B may comprise a first sub-process (not illustrated) for removing the thin etch stop layer 134B from the first semiconductor device 100A and a second sub-process (not illustrated) for removing the doped spacer-forming material layer 132B from the first semiconductor device 100A. In an illustrative embodiment herein, an isotropic etch process may be applied to the first semiconductor device 100A in order to remove the doped spacer-forming material layer 132B from above the first device region 110A and the first gate structure 120A (FIG. 1A). For example, the isotropic etch process for removing the doped spacer-forming material layer 132B from above the first semiconductor device 100A may be a time-controlled wet etch process.

Figure 1D:
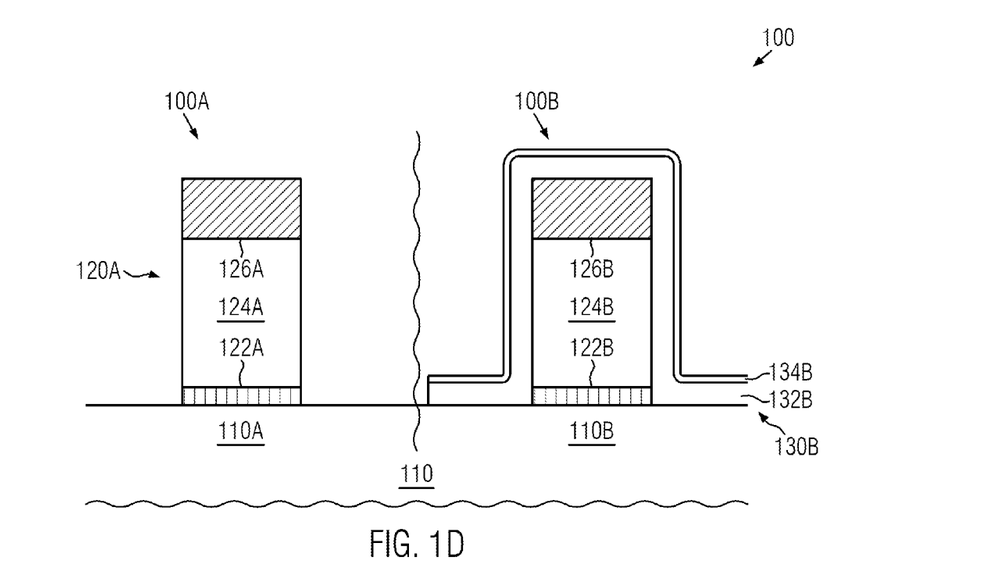

FIG. 1D illustrates the semiconductor device structure at a more advanced stage during fabrication, i.e., after the spacer-forming system 130B is removed from above the first semiconductor device 100A. As illustrated in FIG. 1D, at this stage during fabrication, the first gate structure 120A is exposed, while the second semiconductor device 100B comprises the spacer-forming system 130B formed over the second device region 110B and the second gate structure 120B (FIG. 1A).

Figure 1E:
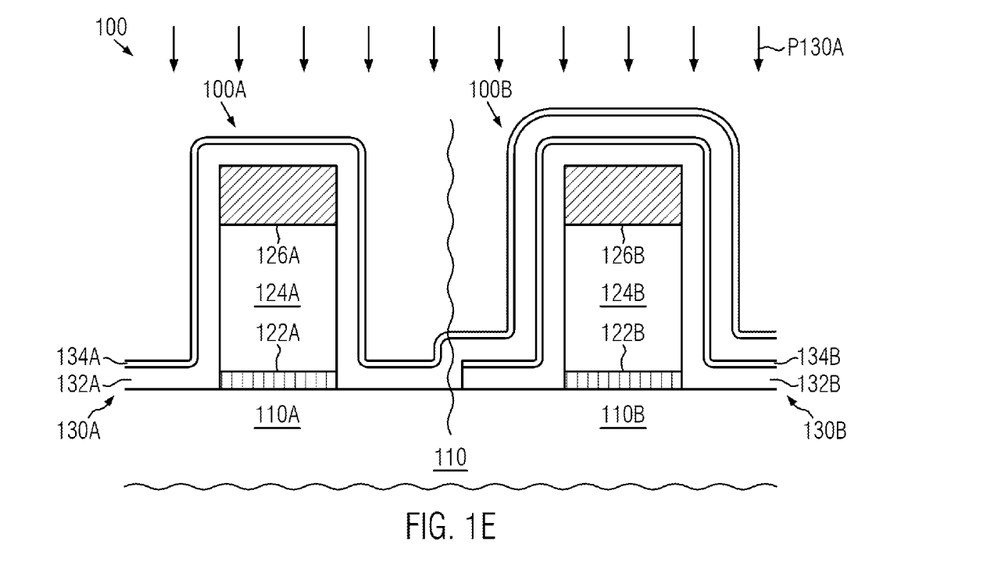

FIG. 1E illustrates the semiconductor device structure at a more advanced stage during fabrication. As shown in FIG. 1E, a further spacer-forming system 130A is formed over the first and second semiconductor devices 100A and 100B. Particularly, the further spacer-forming system 130A is formed over the first device region 110A and the first gate structure 120A (FIG. 1A) and over the second device region 110B and the second gate structure 120B (FIG. 1A) and on the spacer-forming system 130B.

The further spacer-forming system 130A may be formed by performing a process P130A. In one illustrative embodiment, the process P130A may substantially correspond to the process P130B (FIG. 1B) which was used to form the spacer-forming system 130B over the first and second device regions 110A and 110B. Accordingly, the further spacer-forming system 130A may comprise a doped spacer-forming material layer 132A and a further thin etch stop layer 134A. The process P130A may substantially correspond to the process P130B with the difference of incorporating further dopants into the doped spacer-forming material layer 132A such that dopants of one of group III elements and group IV elements may be incorporated into doped spacer-forming material layer 132B while dopants of the other group may be incorporated in the doped spacer-forming material layer 132A. Therefore, the doped spacer-forming material layers 132A, 132B may be doped to implement an opposite conductivity type, i.e., doped spacer-forming material layer 132B may be of one of a P-type conductivity type and an N-type conductivity type, while the doped spacer-forming material layer 132A may show the opposite conductivity type to that of the spacer-forming material layer 132B.

Although the further spacer-forming system 130A is illustrated as comprising the thin etch stop layer 134A, the person skilled in the art will appreciate that no limitation of the present disclosure is intended. In alternative embodiments (not illustrated), the further etch stop layer 134A may be omitted, i.e., only the doped spacer-forming material layer 132A may be deposited.

Figure 1F:
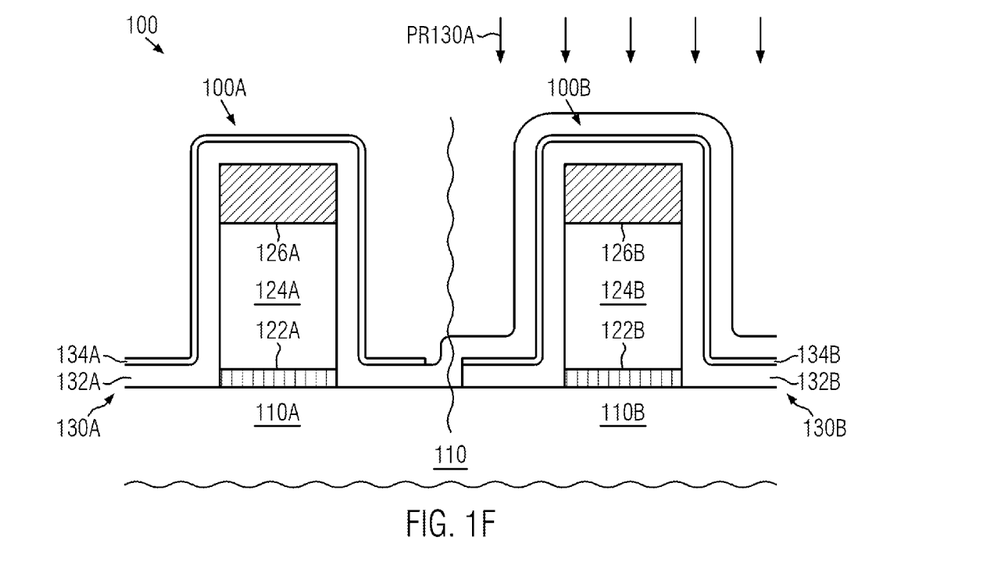

FIG. 1F illustrates the semiconductor device structure at a more advanced stage during fabrication, i.e., when a process PR130A is applied to the second semiconductor device 100B. The person skilled in the art will appreciate that the first semiconductor device 100A is not exposed to the process PR130A. In some illustrative embodiments herein, the first semiconductor device 100A is protected by a masking pattern (not illustrated) which may be formed over the first semiconductor device 100A by means of known lithography processes.

The process PR130A is performed to remove the spacer-forming system 130A from above the second semiconductor device 100B and particularly from above the spacer-forming system 130B formed above the second gate structure 120B (FIG. 1A) and the second device region 110B. The process PR130A may comprise an isotropic etch process acting on exposed areas of the second semiconductor device 100B and particularly on the exposed doped spacer-forming material layer 132A formed over the spacer-forming system 130B of the second semiconductor device 100B. The person skilled in the art will appreciate that the process PR130A may be self-limited so as to stop on the etch-stop layer 134B such that the doped spacer-forming material layer 132B is protected from being exposed to the process PR130A at the illustrated stage during fabrication.

Figure 1G:
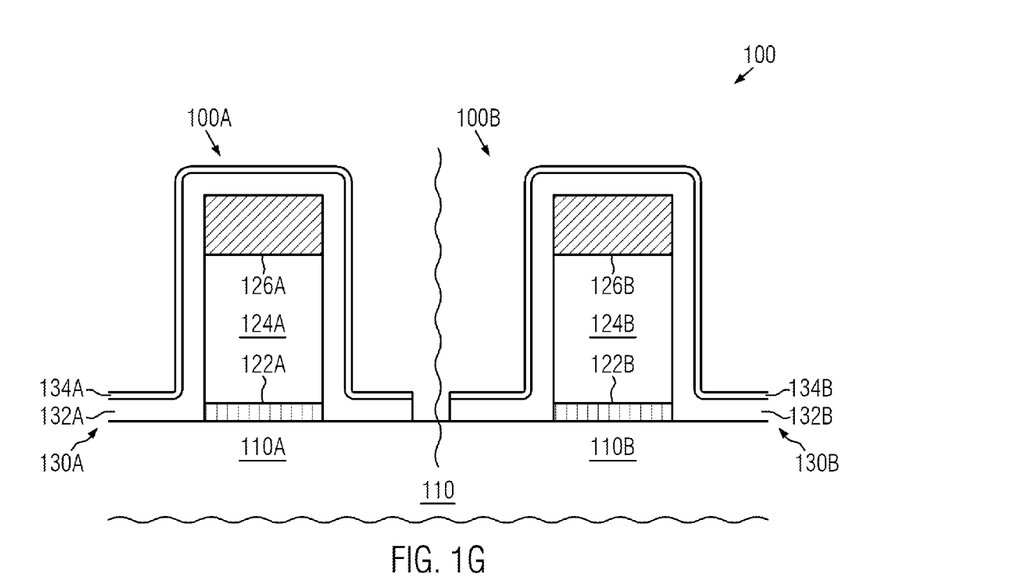

FIG. 1G illustrates the semiconductor device structure at a more advanced stage during fabrication, i.e., after the spacer-forming system 130A is only formed over the first device region 110A and the first gate structure 120A (FIG. 1A) and the spacer-forming system 130B is only formed over the second device region 110B and the second gate structure 120B (FIG. 1A).

Figure 1H:
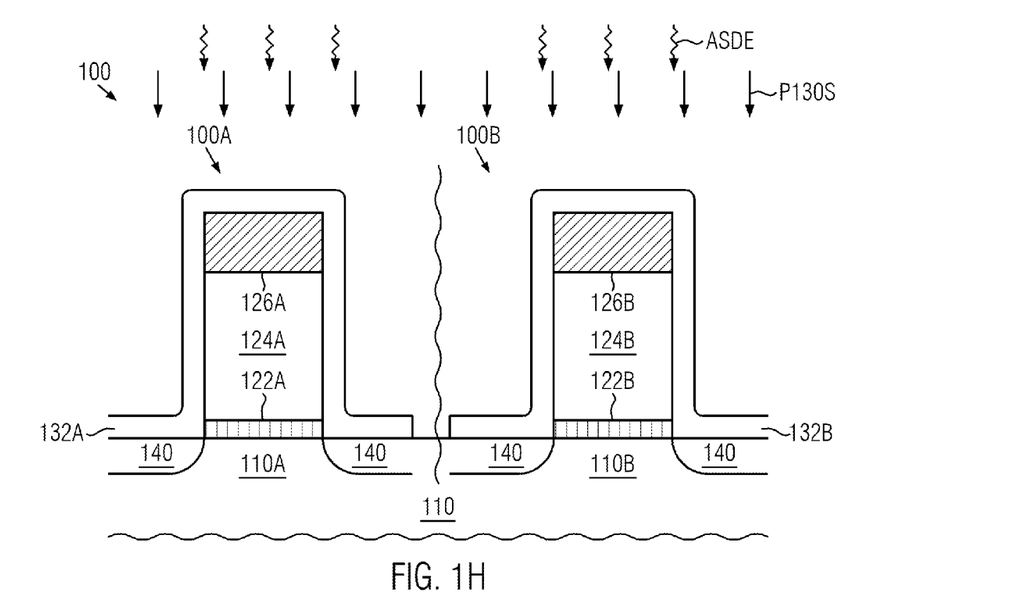

FIG. 1H shows the semiconductor device structure at a more advanced stage during fabrication, i.e., after the thin etch stop layers 134A, 134B are removed from above the respective doped spacer-forming material layers 132A, 132B. The person skilled in the art will appreciate that the thin etch stop layers 134A, 134B may be simultaneously removed, such as, for example, by applying DHF in cases where the thin etch stop layers 134A, 134B are formed by a silicon oxide material.

In some illustrative embodiments, a thermal annealing process ASDE may be applied at this stage during fabrication to diffuse dopants incorporated in the doped spacer-forming material layers 132A, 132B into the first and second device regions 110A, 110B such that source/drain extension regions 140 are formed in the respective device regions 110A, 110B. In an illustrative example herein, the thermal annealing process ASDE may comprise exposing the first and second semiconductor devices 100A, 100B to an annealing temperature out of the range from about 800-1200° C. for about 5 seconds to 40 minutes or, for example, for about 10 seconds to 30 minutes. The person skilled in the art will appreciate that, due to the thermal annealing process ASDE, dopants from the doped spacer-forming material layers 132A, 132B diffuse into the underlying semiconductor material 110 of the respective first and second device regions 110A, 110B such that, after having performed the annealing process ASDE, a concentration of dopants at interfaces of the doped spacer-forming material layers 132A, 132B and the first and second device regions 110A, 110B are substantially equal. Particularly, a concentration of dopants within the first and second device regions 110A, 110B is substantially equal to a concentration of dopants in the doped spacer-forming material layers 132A, 132B at a close proximity of the interfaces between the doped spacer-forming material layers 132A, 132B and the first and second device regions 110A, 110B.

Subsequently, a process P130S may be applied to the doped spacer-forming material layers 132A, 132B so as to shape the doped spacer-forming material layers 132A, 132B. In an illustrative example herein, the process P130S may be an anisotropic etch process.

Figure 1I:
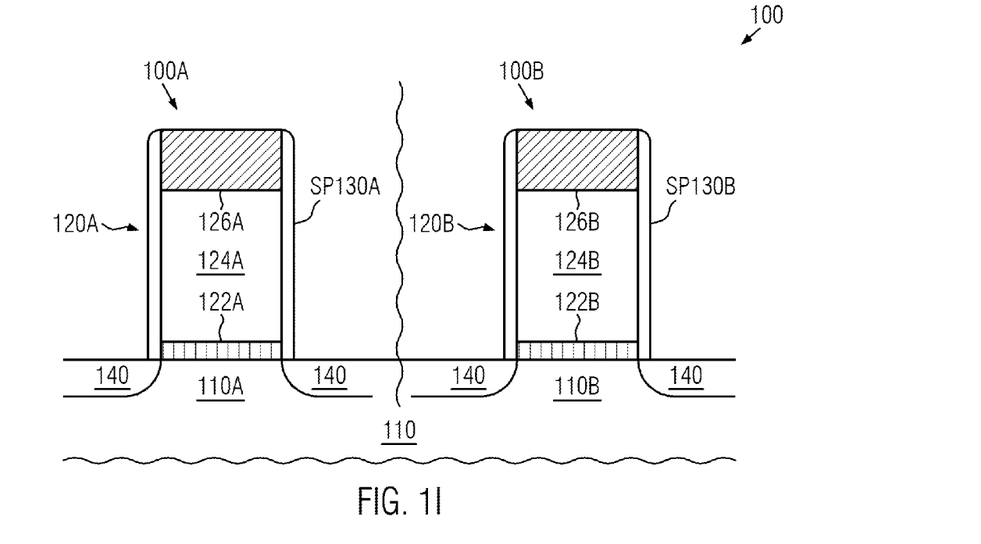

FIG. 1I shows the semiconductor device structure at a more advanced stage during fabrication, i.e., after the process P130S (FIG. 1H) is completed. As a result, a first spacer SP130A is formed adjacent to the first gate structure 120A over the first device region 110A and a second spacer SP130B is formed adjacent to the second gate structure 120B over the second device region 110B. As illustrated in FIG. 1I, the source/drain extension regions 140 are aligned with the respective first and second spacers SP130A, SP130B.

The person skilled in the art will appreciate that, in performing a method along the line of the above-described illustrative embodiments relating to the illustrations in FIGS. 1A-1I, a highly tunable process is disclosed which allows for forming source/drain extension regions within device regions of semiconductor devices having a well-defined gate overlap with corresponding gate structures and showing an improved abruptness of a doping profile of the source/drain extension regions due to a well-controlled diffusion process of dopants included into doped spacer-forming material layers covering respective semiconductor devices. The person skilled in the art will appreciate that, due to high conformal deposition of in situ doped spacer material, a highly conformal dopant profile for the source/drain extension regions may be formed within respective device regions of a semiconductor material. In using in situ doped semiconductor material, crystal damages due to implantation processes may be avoided, while critical shadowing effects particularly present when three-dimensional device regions and particularly multi-gate semiconductor devices are considered, may be avoided.

Although the annealing process ASDE is performed in some illustrative embodiments prior to the spacer shaping process P130S, this does not pose any limitation on the present disclosure. In other illustrative embodiments, the spacer shaping process P130S may be performed prior to performing the annealing process ASDE. However, in these embodiments, source/drain extension regions are only formed in the device regions under the shaped spacers.

In applying methods as described in various illustrative embodiments with regard to FIGS. 1A-1I, separate N- and P-MOSFET devices may be fabricated.

With regard to FIGS. 2 and 3, various illustrative embodiments of semiconductor devices according to the present disclosure will be described.

Figure 2:
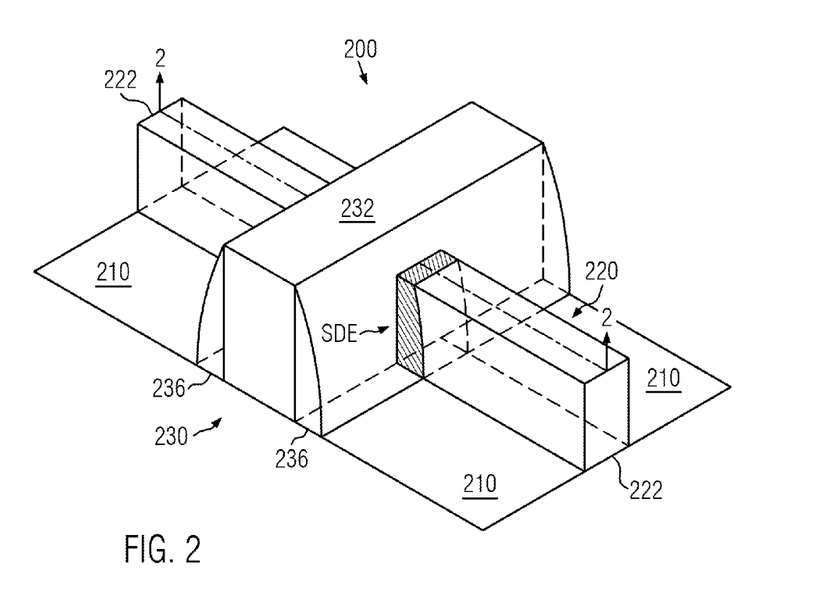
FIG. 2 schematically illustrates in a perspective view a semiconductor device in accordance with an illustrative embodiment of the present disclosure.

FIG. 2 schematically illustrates in a perspective view a semiconductor device 200 of a finFET type. The semiconductor device 200 is formed on or in a surface of a semiconductor material 210, such as an upper surface of a semiconductor layer in an SOI configuration (so called SOI fin) or an upper surface of a semiconductor substrate of a bulk configuration. In the perspective view as illustrated in FIG. 2, dashed lines represent edges that are not directly visible in the illustrated perspective view.

The semiconductor device 200 as illustrated in FIG. 2 may be obtained by a fin 220 being formed in or on the semiconductor material 210. The fin 220 may be obtained by forming a stripe pattern on the surface of the semiconductor material 210 and etching recesses into the surface of the semiconductor material 210 in accordance with the stripe pattern, resulting in the fin 220 being formed in the surface of the semiconductor material 210 and the fin 220 being delineated by at least two recesses 222 formed at opposing sides of the fin 220. Alternatively, the fin 220 may be formed on the surface of the semiconductor material 210 by depositing semiconductor material on the surface of the semiconductor material 210 in accordance with the stripe pattern formed in the surface of the semiconductor material 210, resulting in the fin 220 being deposited on the surface of the semiconductor material 210.

The fin 220 is provided in or on the surface of the semiconductor material 210 such that a longitudinal direction of the fin 220 is substantially perpendicular to a normal direction of the surface of the semiconductor material 210. Transverse the fin 220, i.e., traverse to its longitudinal direction, a gate structure 230 is formed over the surface of the semiconductor material 210 such that the gate structure 230 transversally overlies the fin 220 defining a channel region of the fin as by a portion of the fin 220 that is covered by the gate structure 230. The person skilled in the art will appreciate that, in this way, a bi-gate or a tri-gate semiconductor device may be obtained, wherein a gate dielectric (not illustrated in FIG. 2) is directly formed on two (bi-gate) or three (tri-gate) faces of the fin 220. The gate structure 230 as schematically illustrated in FIG. 2 has a gate electrode structure 232 (possibly comprising a gate dielectric layer structure, a gate electrode material or a replacement gate material) and sidewall spacers 236 formed at opposing sidewalls of the gate electrode structure 232 of the gate structure 230. The person skilled in the art will appreciate that the sidewall spacers 236 overly a portion of the fin 220, as illustrated in FIG. 2 by the shaded portion denoted by SDE.

The person skilled in the art will appreciate that the sidewall spacer 236 may be formed in accordance with methods as explained with regard to FIGS. 1A-1I. In this regard, the illustrations in FIGS. 1A-1I may be understood as cross-sectional views of upper portions taken along the broken line 2-2 along a direction as indicated by the arrows 2 in FIG. 2. Particularly, the device regions 110A, 110B would accordingly correspond to the fin 220. It is easy to see that, in applying methods as explained with regard to FIGS. 1A-1I to the fin 220, source/drain extension regions as indicated by shaded portion SDE in FIG. 2 may be obtained when diffusing dopants incorporated in the sidewall spacers 236 into the fin 220 and particularly into the shaded portion SDE.

The above explanations are not limiting to the present disclosure and the person skilled in the art will appreciate that the semiconductor material 210 may be replaced by an insulating material when SOI configurations are considered. In according SOI configurations, the person skilled in the art will appreciate that the fin 220 is, therefore, disposed on a surface of the insulating material 210.

Figure 3:
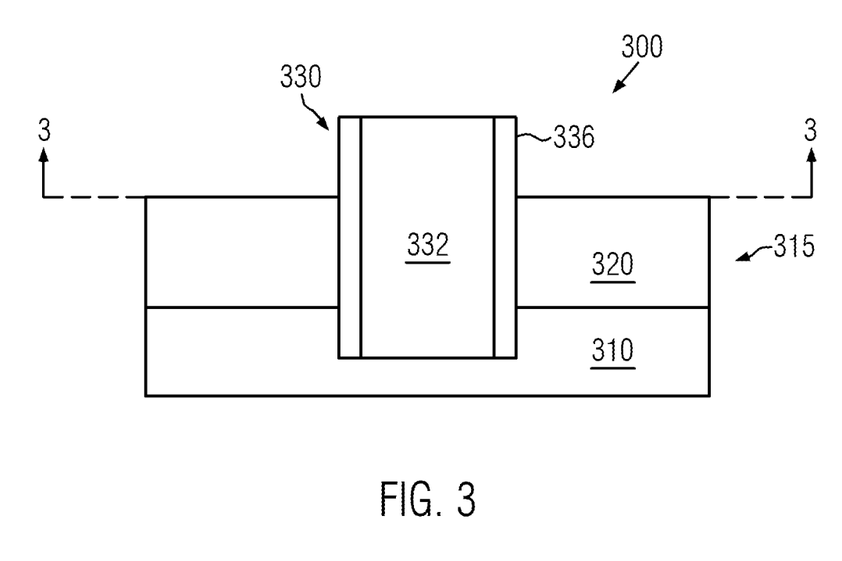
FIG. 3 schematically illustrates in a cross-sectional view a semiconductor device in accordance with another illustrative embodiment of the present disclosure.

FIG. 3 illustrates in a cross-sectional view a semiconductor device 300 in accordance with another illustrative embodiment of the present disclosure. The illustrated semiconductor device 300 is implemented in an SOI configuration where a semiconductor layer 315 is formed on an insulating substrate 310. An elongated semiconductor line 320 is formed in the semiconductor layer 315. A gate structure 330 may be formed over a center portion of the elongated semiconductor line 320, therefore defining a channel region (not illustrated) of the elongated semiconductor line 320. In some illustrative examples, the elongated semiconductor line 320 may represent a fin configuration. In some special examples herein, the semiconductor device 300 may illustrate a so-called wireFET, wherein a channel of a transistor is realized by a substantially one-dimensional semiconductor line or "wire" which may be disposed horizontally or vertically on or over a substrate having a gate electrode on a portion of its surface at least partially wrapping around the wire. In this way, a current flow through the wire may be controlled by applying a voltage to the gate electrode. The term "one-dimensional" may, for example, relate to objects having an aspect ratio of 500 or more, for example 1000 or more.

In a special illustrative embodiment, the gate structure 330 as illustrated in FIG. 3 may be of a gate-all-around type such that the gate structure 330 wraps around the elongated semiconductor line 320. The gate-all-around configuration may be formed by removing a portion of the insulating substrate 310 under the elongated semiconductor line 320. The person skilled in the art will appreciate that, initially, the elongated semiconductor line 320 may be appropriately covered by a masking pattern such that a central portion of the elongated semiconductor line 320 may remain substantially uncovered. In applying an etch process, which may be, for example, an isotropic etch process, material of the insulating substrate 310 may be removed in alignment with the elongated semiconductor line 320, wherein, due to the isotropic character, material of the insulating substrate 310 present under the elongated semiconductor line 320 may be substantially removed. In illustrative examples herein, the etch process may be a dry etch process, such as a plasma etch process or a remote plasma process, wherein the semiconductor device 300 is exposed to a plasma created from a reacting gas in a plasma generation chamber that is separate from the reaction chamber. The person skilled in the art will appreciate that selectivity of the etch process may be obtained by appropriately selecting the composition of the reactant gas and other parameters of the etch process, such as, for example, temperature and pressure of the reactant gas and/or the power of the electric discharge employed for creating the plasma. A reactant gas may, for example, include $CF_4SF_6$ and/or $CF_3$ for selectively etching silicon dioxide relative to silicon and silicon nitride, as the person skilled in the art will appreciate. In other illustrative embodiments, the etch process may be a wet etch process, for example comprising DHF.

Due to the isotropy of the etch process discussed above, the etch process can remove portions of the insulating substrate 310 directly below the elongated semiconductor line 320. The person skilled in the art will appreciate that the extension of an opening created directly under the elongated semiconductor line 320 may be controlled by an appropriate selection of the amount of etching of the insulating substrate 310. After having formed the opening directly under the elongated semiconductor line 320, the gate structure 330 may be formed wrapping around the elongated semiconductor line 320 at its center portion, particularly in forming a gate electrode structure 332 comprising forming a gate insulating layer (not illustrated) and gate electrode material on the exposed faces of the fin's surface. In special illustrative examples herein, a CVD process may be employed for forming the gate insulation layer (not illustrated) which may comprise depositing one or more high-k dielectric materials on exposed faces of the fin's surface. The gate electrode material may be deposited, for example, by means of a CVD process or a PECVD process. The person skilled in the art will appreciate that, when using isotropic deposition processes, a complete filling of the opening directly under the elongated semiconductor line 320 may be achieved such that the gate-all-around configuration of the gate structure 330 may be obtained. After having completed the gate electrode structure 332, a spacer 336 may be formed adjacent to the gate electrode structure 332 over the elongated semiconductor line 320 in accordance with methods as explained above with regard to FIGS. 1A-1I. It is to be understood that, in this respect, FIGS. 1A-1I represent upper views of a cross-sectional view taken along a line 3-3 in direction of arrows 3 as indicated in FIG. 3. Particularly, device regions 110A, 110B may be identified with upper portions of the elongated semiconductor line 320.

The present disclosure explicitly discloses a semiconductor device structure having a first and a second device region provided in a semiconductor material which is provided on a substrate. Over the first device region and the second device region, respective first and second gate structures are formed. Adjacent to the first gate structure and over the first device region, a first spacer is formed. Adjacent to the second gate structure and over the second device region, a second spacer is formed. Within the first device region in alignment with the first spacer and within the second device region in alignment with the second spacer, respective first and second source/drain extension regions are provided, wherein the first spacer has first dopants incorporated therein and the second spacer has second dopants incorporated therein. The concentration of the first dopants within the first spacer close to the first source/drain extension regions substantially corresponds to a concentration of the first dopants within the first source/drain extension regions close to the first spacer. The concentration of the second dopants within the second spacer close to the second source/drain extension regions substantially corresponds to the concentration of the second dopants within the second source/drain extension regions close to the second spacer. It is possible that the first device region may represent a first fin formed in or on the first device region and the second device region may represent a second fin formed in or on the second device region. The person skilled in the art will appreciate that, accordingly, the first gate structure may therefore overly the first fin and the second gate structure may overly the second fin such that multiple gate devices are formed. It is still possible that, alternatively or additionally, the substrate may be provided by an insulating substrate and the semiconductor material may be provided as a semiconductor layer disposed on a surface of the insulating substrate. Herein, a first elongated semiconductor line may be formed in the semiconductor layer in the first device region and a second elongated semiconductor line may be formed in the semiconductor layer in the second device region, wherein a longitudinal direction of each of the first and second elongated semiconductor lines extends substantially perpendicularly to a normal direction of the surface. Furthermore, each of the first and second elongated semiconductor lines may comprise a channel region and the first and second gate structures may extend all around the channel regions of the first and second elongated semiconductor lines such that a gate-all-around configuration is obtained.

The present disclosure further explicitly discloses a semiconductor device having a semiconductor material provided on a substrate and a gate structure formed over a surface of the semiconductor material. A spacer is formed adjacent to the gate structure partially covering the surface and source/drain extension regions are formed within the semiconductor material in alignment with the spacer. Furthermore, the spacer has dopants incorporated therein and a concentration of the dopants within the spacer close to the surface substantially corresponds to a concentration of the dopants within the source/drain regions close to the surface. It is possible that a fin is formed in or on the surface such that the gate structure overlies the fin and the source/drain extension regions are disposed within the fin and substantially covered by the spacer. Additionally or alternatively, the substrate may be an insulating substrate and the semiconductor material may be provided as a semiconductor layer disposed on a surface of the insulating substrate. Herein, one or more elongated semiconductor lines may be formed in the semiconductor layer and a longitudinal direction of each of the one or more elongated semiconductor lines may extend substantially perpendicularly to a normal direction of the surface, wherein a portion of the insulating substrate below a central portion of each of the one or more elongated semiconductor lines may be removed such that an opening is formed within the insulating substrate directly under the one or more elongated semiconductor lines. The gate structure is herein formed on the central portions of each of the one or more semiconductor lines such that the gate structures extend all around the central portions of each of the one or more elongated semiconductor lines. The person skilled in the art will appreciate that a semiconductor device having a gate-all-around configuration is presented.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a semiconductor material positioned above a substrate;
   a gate structure positioned above a surface of said semiconductor material, said gate structure covering a non-planar surface portion of said surface;
   a sidewall spacer positioned adjacent to said gate structure and comprising first dopants having one of an N-type and a P-type conductivity, wherein said sidewall spacer covers an entire sidewall surface of said gate structure and partially covers said surface of said semiconductor material; and
   source/drain extension regions comprising said first dopants and positioned within said non-planar surface portion and in alignment with said sidewall spacer, wherein a concentration of said first dopants within a portion of said sidewall spacer proximate said non-planar surface portion substantially corresponds to a concentration of said first dopants within said source/drain extension regions proximate said non-planar surface portion.

2. The semiconductor device of claim 1, wherein said non-planar surface portion comprises a fin that is positioned in or above said surface of said semiconductor material, wherein said gate structure extends across and is positioned around a portion of said fin, and wherein said source/drain extension regions are positioned within said fin and are substantially covered by said sidewall spacer.

3. The semiconductor device of claim 1, wherein said non-planar surface portion comprises a semiconductor wire that is positioned in or above said surface of said semiconductor material, wherein said gate structure extends across and is positioned around a portion of said semiconductor wire, and wherein said source/drain extension regions are positioned within said semiconductor wire and are substantially covered by said sidewall spacer.

4. The semiconductor device of claim 1, wherein said gate structure is a replacement gate structure comprising at least one of a high-k gate dielectric material and a work function adjusting material.

5. The semiconductor device structure of claim 1, wherein said first dopants comprise one of a group III element and a group V element.

6. A semiconductor device structure, comprising:
a first device region and a second device region positioned in a semiconductor material, said semiconductor material being positioned above a substrate;
a first gate structure positioned above said first device region and a second gate structure positioned above said second device region, said first gate structure covering a first non-planar surface portion of said first device region and said second gate structure covering a second non-planar surface portion of said second device region;
a first sidewall spacer positioned adjacent to said first gate structure, said first sidewall spacer covering an entire sidewall surface of said first gate structure and comprising first dopants having a first type of conductivity;
a second sidewall spacer positioned adjacent to said second gate structure, said second sidewall spacer covering an entire sidewall surface of said second gate structure and comprising second dopants having a second type of conductivity that is opposite of said first type of conductivity;
first source/drain extension regions comprising said first dopants and positioned within said first device region and in alignment with said first sidewall spacer, wherein a concentration of said first dopants within a portion of said first sidewall spacer proximate said first source/drain extension regions substantially corresponds to a concentration of said first dopants within a portion of said first source/drain extension regions proximate said first sidewall spacer; and
second source/drain extension regions comprising second dopants and positioned within said second device region and in alignment with said second sidewall spacer, wherein a concentration of said second dopants within a portion of said second sidewall spacer proximate said second source/drain extension regions substantially corresponds to a concentration of said second dopants within a portion of said second source/drain extension regions proximate said second sidewall spacer.

7. The semiconductor device structure of claim 6, wherein said first non-planar surface portion comprises a first fin that is positioned in or above said first device region and said second non-planar surface portion comprises a second fin that is positioned in or above said second device region, and wherein said first gate structure extends across and is positioned around a portion of said first fin and said second gate structure extends across and is positioned around a portion of said second fin.

8. The semiconductor device structure of claim 6, wherein said first non-planar surface portion comprises a first semiconductor wire that is positioned in or above said first device region and said second non-planar surface portion comprises a second semiconductor wire that is positioned in or above said second device region, and wherein said first gate structure extends across and is positioned around a portion of said first semiconductor wire and said second gate structure extends across and is positioned around a portion of said second semiconductor wire.

9. The semiconductor device structure of claim 6, wherein at least one of said first and second gate structures is a replacement gate structure comprising at least one of a high-k gate dielectric material and a work function adjusting material.

10. The semiconductor device structure of claim 6, wherein said substrate is an insulating substrate and said semiconductor material is provided as a semiconductor layer disposed on a surface of said insulating substrate, wherein said first non-planar surface portion comprises a first elongated semiconductor line that is positioned in said first device region and comprises a first channel region and said second non-planar surface portion comprises a second elongated semiconductor line that is positioned in said second device region and comprises a second channel region, and wherein said first gate structure extends across said first elongated semiconductor line and is positioned all around said first channel region and said second gate structure extends across said second elongated semiconductor line and is positioned all around said second channel region.

11. The semiconductor device structure of claim 6, wherein said first dopants comprise one of a group III element and said second dopants comprise one of a group V element.

12. A semiconductor device, comprising:
one or more elongated semiconductor lines positioned above an insulating substrate;
a gate structure extending across and positioned all around a portion of each of said one or more elongated semiconductor lines, wherein a lower portion of said gate structure is embedded in said insulating substrate and extends below a lower surface of said portion of each of said one or more elongated semiconductor lines;
a sidewall spacer positioned adjacent said gate structure, said sidewall spacer comprising first dopants having one of an N-type and a P-type conductivity; and
source/drain extension regions comprising said first dopants and positioned within each of said one or more elongated semiconductor lines, wherein a concentration of said first dopants within a portion of said sidewall spacer proximate said source/drain extension regions within each of said one or more elongated semiconductor lines substantially corresponds to a concentration of said first dopants within a portion of said source/drain extension regions proximate said sidewall spacer.

13. The semiconductor device of claim 12, wherein said source/drain extension regions are substantially covered by said sidewall spacer.

14. The semiconductor device of claim 12, wherein said sidewall spacer covers an entire sidewall surface of said gate structure.

15. The semiconductor device of claim 12, wherein said gate structure is a replacement gate structure comprising at least one of a high-k gate dielectric material and a work function adjusting material.

16. The semiconductor device structure of claim 12, wherein said first dopants comprise one of a group III element and a group V element.

* * * * *